(12) United States Patent
Nelson et al.

(10) Patent No.: US 7,352,837 B2
(45) Date of Patent: Apr. 1, 2008

(54) DIGITAL PHASE-LOCKED LOOP

(75) Inventors: Dale H. Nelson, Macungie, PA (US); Parag Parikh, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 683 days.

(21) Appl. No.: 10/856,447

(22) Filed: May 28, 2004

(65) Prior Publication Data

US 2005/0265505 A1    Dec. 1, 2005

(51) Int. Cl.
 *H03D 3/24* (2006.01)
(52) U.S. Cl. ...................................... 375/376; 324/147
(58) Field of Classification Search ................ 375/376, 375/215; 327/141, 147; 331/57; 324/103
 See application file for complete search history.

(56) References Cited

U.S. PATENT DOCUMENTS

| | | | | |
|---|---|---|---|---|
| 4,151,485 A | * | 4/1979 | LaFratta | 331/1 A |
| 5,057,794 A | * | 10/1991 | Shih | 331/1 A |
| 5,349,309 A | * | 9/1994 | Fujii | 331/17 |
| 5,351,275 A | * | 9/1994 | Wong et al. | 375/376 |
| 5,490,182 A | | 2/1996 | Arai | |
| 5,596,610 A | * | 1/1997 | Leung et al. | 375/376 |
| 5,771,264 A | | 6/1998 | Lane | |
| 5,923,715 A | * | 7/1999 | Ono | 375/376 |
| 5,939,947 A | * | 8/1999 | Nakao et al. | 331/11 |
| 6,104,682 A | * | 8/2000 | Konishi | 369/44.34 |
| 6,687,321 B1 | | 2/2004 | Kada et al. | |
| 2003/0215039 A1 | * | 11/2003 | Block et al. | 375/376 |
| 2004/0223578 A1 | * | 11/2004 | Lagarde | 375/376 |
| 2004/0247066 A1 | * | 12/2004 | Suda | 375/376 |
| 2005/0264367 A1 | * | 12/2005 | Munker et al. | 331/16 |

* cited by examiner

*Primary Examiner*—David C. Payne
*Assistant Examiner*—Leon-Viet Q Nguyen

(57) ABSTRACT

A phase-locked loop includes a variable frequency generator, a comparator and a counter. The variable frequency generator is configurable for generating an output signal having a frequency which varies based at least in part on at least first and second control signals presented thereto. The comparator is configurable for receiving a first signal and a second signal, the first signal being an input signal presented to the phase-locked loop and the second signal being representative of the output signal from the variable frequency generator. The comparator generates a difference signal representative of a difference between a phase and/or a frequency of the first and second signals, the difference signal comprising the first control signal. The counter is configurable for generating an output count based at least in part on the difference signal from the comparator. The output count is a digital representation of the difference signal, the output count comprising the second control signal. The frequency of the output signal from the variable frequency generator is determined as a function of the difference signal and the output count.

21 Claims, 4 Drawing Sheets

DIGITAL PHASE-LOCKED LOOP

FIELD OF THE INVENTION

The present invention relates generally to the field of electronic circuits, and more particularly relates to phase-locked loops (PLLs).

BACKGROUND OF THE INVENTION

A PLL is a frequency-selective feedback system that is capable of synchronizing with an applied input signal and tracking frequency changes associated therewith. PLLs are used in a wide variety of applications, including, but not limited to, frequency synthesizers, clock and data recovery circuits, and communications systems. FIG. 1 illustrates a basic analog PLL 100 comprising four functional blocks, namely, a phase detector 102, a charge pump 104, a loop filter 106, and a voltage-controlled oscillator (VCO) 108. These four blocks 102, 104, 106, 108 are interconnected in a feedback arrangement as shown. The phase detector 102 compares the phase $\phi_{IN}$ of a reference input signal Vs(t) with a phase $\phi_{VCO}$ of an output signal generated by the VCO 108, and generates an error signal Ve(t). This error signal Ve(t) typically consists of either an UP pulse (when $\phi_{IN}$ leads $\phi_{VCO}$) or a DOWN pulse (when $\phi_{IN}$ lags $\phi_{VCO}$) where the error signal Ve(t) represents a difference between $\phi_{IN}$ and $\phi_{VCO}$. The charge pump 104 generates an amount of charge based on the error signal Ve(t), where the sign of the charge indicates the direction of UP or DOWN.

Depending on whether the error signal Ve(t) was an UP pulse or a DOWN pulse, the charge is either added to or subtracted from, respectively, a capacitance (not shown) in the loop filter 106. Thus, the loop filter 106 functions as an integrator which accumulates the net charges from the charge pump 104. The resulting loop filter voltage Vc(t) is applied to a control input of the VCO 108 for varying the frequency of the output signal generated by the VCO. The basic theory and principle of operation of PLLs are well known, as described, for example, in Alan B. Grebene, "Bipolar and MOS Analog Integrated Circuit Design," pp. 627-678, John Wiley & Sons, 1984, and Dan H. Wolaver, "Phase-Locked Loop Circuit Design," Prentice Hall, N.J., 1991, which are incorporated herein by reference, and therefore not further described herein.

One disadvantage of analog PLLs is that capacitors in the loop filter for accumulating the charge generated by the charge pump often consume a relatively large area in an integrated circuit in which the PLL may be implemented, especially compared to digital circuitry which is often integrated with the PLL. Furthermore, the area consumed by the loop filter capacitors generally does not scale with advances in integrated circuit process technology, making it difficult to reduce the size of the analog PLL. Previous attempts to reduce the size of analog PLLs have involved reducing the charge pump current in order to reduce the size of the capacitors in the loop filter. However, this approach provides only a slight savings in area. Moreover, reducing the charge pump current can significantly increase the susceptibility of the PLL to noise, and therefore undesirably increase jitter in an output signal produced by the PLL.

In order to overcome some of the problems inherent in analog PLLs, it is well known to employ digital PLLs (DPLLs). In a conventional DPLL, the charge pump, loop filter and analog VCO are typically replaced with a digital implementation thereof. By eliminating the large capacitors associated with the loop filter, a substantial savings in integrated circuit area can be achieved. However, most DPLLs exhibit an undesirable phenomenon often referred to as "hunting." Hunting results, at least in part, from quantization errors in the digital VCO and/or VCO control voltage, and may cause jitter in the output signal generated by the PLL. Because the output signal of the digital VCO is limited to certain discrete frequencies, a feedback control loop in the DPLL will often overcompensate for the frequency mismatch between the output signal of the VCO and the input reference signal by causing the VCO to continuously speed up and slow down (i.e., "hunt") as the DPLL attempts to match its output to the input reference signal.

There exists a need, therefore, for an improved PLL that does not suffer from one or more of the problems exhibited by conventional PLL arrangements.

SUMMARY OF THE INVENTION

The present invention meets the above-noted need by providing techniques for advantageously reducing an integrated circuit area of a PLL without significantly increasing a hunting effect in the PLL. In order to accomplish this, a DPLL architecture is employed so as to eliminate the conventional loop filter and associated large capacitors which consume a significant amount of integrated circuit area.

In accordance with one aspect of the invention, a phase-locked loop includes a variable frequency generator, a comparator and a counter. The variable frequency generator is configurable for generating an output signal having a frequency which varies based at least in part on at least first and second control signals presented thereto. The comparator is configurable for receiving a first signal and a second signal, the first signal being an input signal presented to the phase-locked loop and the second signal being representative of the output signal from the variable frequency generator. The comparator generates a difference signal representative of a difference between a phase and/or a frequency of the first and second signals, the difference signal comprising the first control signal. The counter is configurable for generating an output count based at least in part on the difference signal from the comparator. The output count is a digital representation of the difference signal, the output count comprising the second control signal. The frequency of the output signal from the variable frequency generator is determined as a function of the difference signal and the output count.

In accordance with another embodiment of the invention, a phase-locked loop includes a variable frequency generator, a comparator, first and second counters and a divider. The variable frequency generator is configurable for generating an output signal having a frequency which varies based at least in part on a first control signal presented thereto. The comparator is configurable for receiving a first signal and a second signal, the first signal being an input signal presented to the phase-locked loop and the second signal being representative of the output signal from the variable frequency generator. The comparator generates a difference signal representative of a difference between a phase and/or a frequency of the first and second signals. The first counter is configurable for generating an output count based at least in part on the difference signal from the comparator. The output count is a digital representation of the difference signal, the output count of the first counter including the first control signal, the frequency of the output signal from the variable frequency generator being determined as a function of the output count of the first counter. The divider is connected between the variable frequency generator and the comparator, the divider having a selectable divide value associated therewith and being configurable for receiving the output signal from the variable frequency generator and for generating the second signal based on the divide value. The second counter is configurable for generating an output count in response to the first counter generating an overflow or an underflow, the output count of the second counter representing a duration of the overflow or underflow of the first counter. The divide value of the first divider is selected based on the output count of the second counter.

In an illustrative embodiment of the invention, unlike conventional DPLLs, a unique connection is provided between a phase-frequency detector and a variable ring oscillator in the DPLL in order to reduce hunting in the DPLL. An up/down counter is provided in the DPLL as a primary means for controlling the frequency of an output signal generated by the variable ring oscillator. The frequency of the output signal increases in response to a decreasing output count generated by the up/down counter, and vice versa. The DPLL is configured such that the frequency of the output signal of the variable ring oscillator is directly controlled, to a lesser extent than the up/down counter, by the phase-frequency detector via the connection therebetween. Additionally, the DPLL is beneficially configured to extend a frequency range of the variable frequency oscillator based on an overflow or an underflow condition generated by the up/down counter.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a single-loop DPLL circuit and associated integrated circuit implementations thereof. It should be understood, however, that the present invention is not limited to use with the particular circuitry arrangements of the illustrative embodiments shown, and other embodiments may include, but are not limited to, different types and numbers of loops, different functional blocks and circuitry implementations associated therewith, etc. Rather, the present invention provides, in one aspect, techniques for advantageously reducing the area consumed by a PLL, without significantly increasing a hunting effect in the PLL. Moreover, since the DPLL employs a primarily digital architecture, the overall size of the DPLL can be advantageously scaled with advances in integrated circuit process technology. The DPLL formed in accordance with the present invention is particularly well-suited for use in a wide variety of integrated circuit applications, as well as in non-integrated circuit applications.

Figure 1:
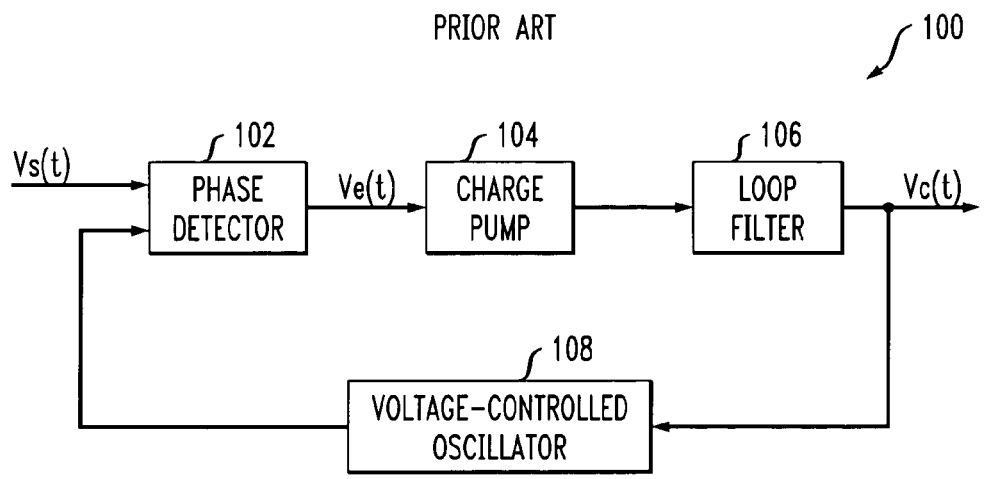
FIG. 1 is a block diagram of a conventional PLL.
Figure 2:
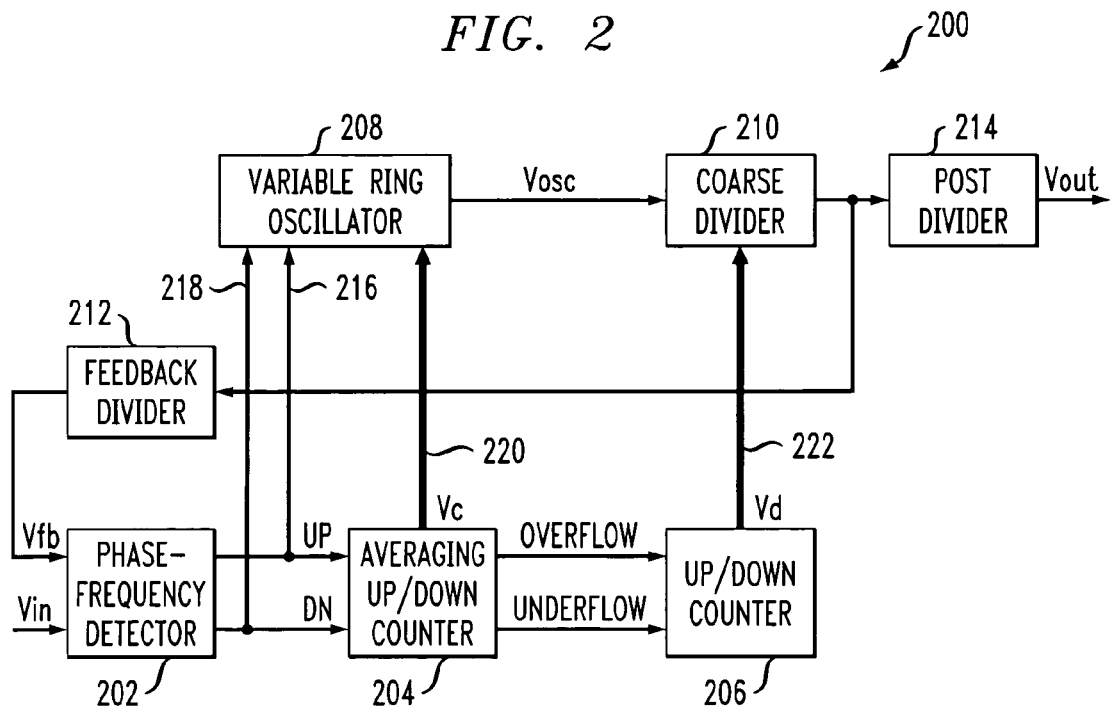
FIG. 2 is a block diagram depicting an exemplary DPLL circuit, formed in accordance with an illustrative embodiment of the invention.

FIG. 2 is a block diagram illustrating at least a portion of an integrated circuit including an exemplary DPLL 200 in which the techniques of the present invention are implemented. The DPLL 200 is preferably operable in a radio frequency (RF) frequency range (e.g., greater than about 350 MHz), although the invention is not limited to any particular frequency range of operation. Without loss of generality but for ease of explanation, the DPLL 200 will be described in terms of functional blocks, including a phase-frequency detector (PFD) 202, an averaging up/down counter (UDC) 204, a second UDC 206, a variable ring oscillator (VRO) 208, a coarse divider 210, a feedback divider 212 and a post divider 214. The PFD 202 may comprise only phase detection circuitry, only frequency detection circuitry, or a combination of phase and frequency detection circuitry, as will be understood by those skilled in the art. Thus, the term "phase-frequency detector" as used herein is intended to include phase detection and/or frequency detection functionalities. It is to be appreciated that in the exemplary DPLL 200, one or more functional blocks may be optional (e.g., post divider 214, feedback divider 212, coarse divider 210 and second UDC 206), and therefore may be omitted in alternative embodiments of the invention.

Although shown as separate functional blocks, at least a portion of one or more of the blocks in the DPLL 200 may be combined and/or integrated either with each other, or with one or more other functional blocks, and certain portions of the combined functional blocks may be shared, as will be understood by those skilled in the art. For example, the averaging UDC 204 and the second UDC 206 may be implemented as a single functional block. A more detailed description of the functional blocks in the DPLL 200 is presented below.

The PFD 202 receives at a first input an input reference signal Vin, having a frequency $f_{IN}$ and a phase $\phi_{IN}$ associated therewith, and receives at a second input a feedback signal Vfb, having a frequency $f_{FB}$ and a phase $O_{FB}$ associated therewith. The feedback signal Vfb is preferably representative of an output signal Vosc generated by the VRO 208, and may be, for example, the output signal Vosc itself (or a buffered version of Vosc) or a multiple thereof. As apparent from the figure, the output signal Vosc may be divided by one or more frequency dividers, such as, for example, coarse divider 210 and feedback divider 212, coupled in series between an output of the VRO 208 and the second input of the PFD 202, thereby forming a feedback loop. The post divider 214, which is often referred to as a postscaler, may be included in the DPLL 200 for generating an output signal Vout of the DPLL that is a selected division of the output signal Vosc of the VRO 208. A prescaler (not shown) may also be optionally employed in the DPLL for dividing the input reference signal Vin by a selected amount prior to being presented to the PFD 202. One or more of the dividers 210, 212, 214 may be implemented in a conventional manner, such as, for example, using a programmable counter, although alternative divider and/or scaling circuitry may also be employed. Additionally, a divide value associated with one or more of the dividers 210, 212 and 214 may be selectively changed based on a corresponding control signal presented thereto.

PFD 202, which may comprise, for example, a conventional type-four phase detector, is preferably configurable for generating one or more control signals, UP and DN, indicative of a difference in phase and/or frequency between the signals Vin and Vfb applied to the first and second inputs, respectively, of the PFD. Signals UP and DN may comprise, for example, pulses having respective pulse widths that are representative of a magnitude of the difference in phase and/or frequency between signals Vin and Vfb. Based on a comparison between the two signals Vin and Vfb, the PFD 202 preferably generates an UP pulse when $\phi_{IN}$ leads $\phi_{FB}$ (or similarly, when $f_{IN}$ leads $f_{FB}$) and generates a DN pulse when $\phi_{IN}$ lags $\phi_{FB}$ (or similarly, when $f_{IN}$ lags $f_{FB}$). It is to be appreciated that, while the PFD 202 in the exemplary DPLL 200 preferably comprises a type-four phase detector, alternative circuitry configurable for comparing the phase and/or frequency of signals Vin and Vfb may also be employed, such as, for example, a multiplier, an exclusive OR (XOR) gate, etc., as will be understood by those skilled in the art.

The averaging UDC 204 in the DPLL 200 replaces a conventional charge pump and loop filter which are generally found in an analog PLL. As previously stated, by eliminating the loop filter, and particularly the large integrating capacitors associated therewith, the size of the DPLL can be significantly reduced in comparison to the size of a traditional analog PLL. Additionally, the averaging UDC 204 beneficially consumes substantially less current than the conventional charge pump. Therefore, the overall current consumption in the DPLL 200 will be significantly less compared to the analog PLL.

Averaging UDC 204 preferably serves as a primary means for controlling the frequency of the output signal Vosc generated by the VRO 208. The averaging UDC 204 receives at first and second inputs the UP and DN signals, respectively, from the PFD 202 and generates a control signal Vc which is supplied to the VRO 208 via connection 220. Control signal Vc may comprise a multiple-bit signal that is representative of a count value of the averaging UDC 204, such as, for example, a binary representation of the count value, and thus connection 220 may comprise a bus. The averaging UDC 204 is preferably configured to increment the count value (count up) in response to a received UP signal, and to decrement the count value (count down) in response to a received DN signal. The value of the count may be based, at least in part, on the pulse widths of the respective UP and DN signals. For example, an UP signal having a longer pulse width will produce a higher count value compared to an UP signal having a shorter pulse width. In this manner, the resulting count value of the averaging UDC 204 will be representative of a magnitude of the difference in phase and/or frequency between the signals Vin and Vfb.

Averaging UDC 204 preferably generates an OVERFLOW signal when the count value is greater than a maximum representable limit associated therewith, e.g., when the counter overflows. Likewise, the averaging UDC 204 preferably generates an UNDERFLOW signal when the count value is smaller in magnitude than a minimum representable limit associated therewith, e.g., when the counter underflows. The second UDC 206 is preferably configurable for receiving the OVERFLOW and UNDERFLOW signals from the averaging UDC 204, and for generating a control signal Vd for controlling a divide value of the coarse divider 210 via connection 222. Control signal Vd may comprise a multiple-bit signal that is representative (e.g., a binary representation) of a count value of UDC 206, and thus connection 222 may comprise a bus. The second UDC 206, like averaging UDC 204, may be implemented in a conventional fashion, as will be understood by those skilled in the art.

An overflow condition may occur when the averaging UDC 204 attempts to decrease the frequency of the output signal Vosc of the VRO 208 below a minimum operational frequency range of the VRO, indicating that the VRO is running too fast. This may result from certain changes in the characteristics of the VRO, including, but not limited to, temperature and/or IC process variations. When an overflow occurs, the second UDC 206 is incremented accordingly to thereby increase the divide value of the coarse divider 210, in accordance with another aspect of the invention. Likewise, an underflow condition may occur when the averaging UDC 204 attempts to increase the frequency of the output signal Vosc above a maximum operational frequency range of the VRO, indicating that the VRO is running too slow. Again, this may result from variations in temperature and/or IC process parameters, among other characteristics, of the VRO. When an underflow occurs, the second UDC 206 is decremented to thereby decrease the divide value of the coarse divider 210. Alternatively, or in addition to controlling the coarse divider 210, the control signal Vd may be used to control the divide value of the feedback divider 212. This control methodology, which is another beneficial aspect of the present invention, involves controlling the division of the VRO output signal Vosc that is fed back to the PFD 202 based on the second UDC 206, thereby extending an effective frequency range of the VRO 208 without increasing the number of delay stages in the VRO. It is to be understood that a divide value of one or more of the feedback divider 212 and post divider 214 may also be selectively controlled, for example, based on the control signal Vd, to provide further design flexibility.

After an overflow or underflow condition, the averaging UDC 204 is preferably reset to a mid-scale value to provide a more beneficial control range using the new divider value selected for the coarse divider 210. In accordance with another aspect of the invention, the DPLL may include control circuitry (not shown) that is configurable for bypassing the averaging UDC 204, at least initially (e.g., prior to locking), to allow the DPLL to determine an approximate divide value for the coarse divider 210 in order to speed the locking process. During the locking process, while the averaging UDC is bypassed, the averaging UDC is preferably held to its mid-scale value to approximate the divider value required for the coarse divider 210.

As previously explained, the control signal Vc provided to the VRO 208 is preferably a digital representation of the difference in phase and/or frequency between the signals Vin and Vfb. Furthermore, the VRO 208 is a digital implementation of an analog VCO, and therefore the frequency of the output signal Vosc from the VRO will vary in discrete steps. The size of the steps in which the frequency of Vosc can be varied will depend, at least in part, on the respective resolutions of the VRO 208 (e.g., the number of delay stages in the VRO) and the averaging UDC 204 (e.g., the number of bits associated with the counter). For example, a 5-stage (e.g., 5-bit) VRO is capable of generating 32 discrete output frequencies. Since the output frequency of Vosc required to substantially match the feedback signal Vfb with the input reference signal Vin may reside somewhere between two discrete steps, the averaging UDC 204 may exhibit hunting by varying the count value up and down between two or more closest count values in an attempt to match the frequency of the output signal Vosc with the input reference signal Vin. This hunting effect is due primarily to the quantization limitations inherent in the DPLL 200 resulting from a combination of the discrete control signal Vc generated by the averaging UDC 204 and the discrete output frequencies of the output signal Vosc generated by the VRO 208.

In order to eliminate or substantially reduce hunting in the DPLL 200, the control signals UP and DN generated by the PFD 202 are provided directly to the VRO 208 via connections 216 and 218, respectively. The VRO 208 is preferably configured such that the frequency of the output signal Vosc is decreased in response to an UP pulse and is increased in response to a DN pulse. The amount of change in the frequency of the Vosc in response to the UP and DN signals is preferably significantly less than the amount of change in the frequency of Vosc in response to control signal Vc from the averaging UDC 204 (e.g., less than about ten percent). The methodology of the invention thus provides a means of adding hysteresis to the exemplary DPLL 200.

Figure 3:
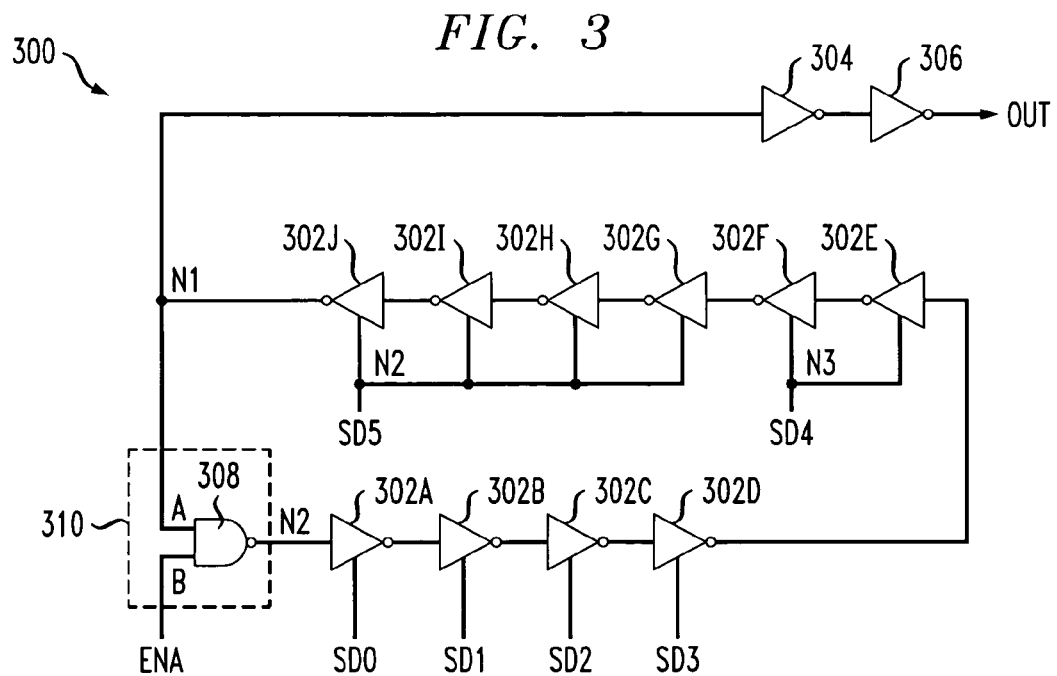
FIG. 3 is a schematic diagram depicting an exemplary ring oscillator suitable for use in the DPLL circuit shown in FIG. 2.

FIG. 3 depicts an illustrative VRO 300 suitable for use in the DPLL of FIG. 2, in accordance with one embodiment of the invention. One skilled in the art will appreciate that various alternative variable frequency generator circuits may also be employed. The VRO 300 preferably includes a plurality of delay stages 302A through 302J connected together in a ring configuration as shown, with an output of one delay stage (e.g., 302A) connected to an input of a successive delay stage (e.g., 302B), and so forth until the ring is closed. The delay stages, which may be referred to collectively as 302, are preferably inverting delay stages. It is to be understood that the VRO 300 is not limited to the particular number and/or type of delay stages shown in the illustrative embodiment thereof, although the ring preferably comprises an odd number of inversions in order to provide positive feedback for sustaining oscillation.

The VRO 300 may comprise one or more buffer stages 304 and 306 for buffering an output OUT of the VRO. Buffer stages 304 and 306 may be implemented as inverters, as shown, and therefore an even number of buffer stages (e.g., two) can be utilized in order to preserve the phase of the output signal OUT. In the exemplary VRO 300, the output signal OUT is based on an output of delay stage 302J at node N1, although the output signal may alternatively be taken from any of the delay stages 302.

VRO 300 may further include enable circuitry 310 for selectively enabling the VRO in response to a control signal ENA presented thereto. The enable circuitry 310 may comprise, for example, a NAND gate 308 connected between a first end of the ring at node N1 and a second end of the ring at node N2, such that a first input (A) of the NAND gate is connected to node N1, the enable signal ENA is applied to a second input (B) of the NAND gate, and an output of the NAND gate is connected to node N2. By way of example only, when signal ENA is at a logic low level, node N2 will be forced to a logic high level, thereby halting oscillation in the VRO 300 and forcing an output OUT of the VRO to be a logic high level. When signal ENA is at a logic high level, NAND gate 308 functions essentially as an inverter which, due to an odd number of inverting stages (e.g., 11), results in an oscillation.

The frequency of the output signal OUT of the VRO 300 is based primarily on the respective delays associated with each of the delay stages 302. The delay of one or more delay stages 302 is preferably selectively adjustable for controlling the frequency of the output signal OUT as desired. In the illustrative embodiment of the VRO 300 shown in FIG. 3, each of the delay stages 302 includes a control input for receiving a corresponding select delay signal SD0, SD1, SD2, SD3, SD4 and SD5 presented thereto. More than one delay stage may receive the same select delay signal. For example, delay stages 302E and 302F receive select delay signal SD4, and delays stages 302G, 302H, 302I and 302J receive select delay signal SD5. Each of the remaining delay stages, for example, 302A, 302B, 302C and 302D, receive separate corresponding select delay signals SD0, SD1, SD2 and SD3, respectively. In this manner, the VRO 300 may be configured such that at least a portion of the select delay signals SD0 through SD5 are weighted, such as, for example, in a binary weighting arrangement. For more precise control over the frequency of output signal OUT, the delay of each delay stage 302A through 302J may be individually controllable by a separate select delay signal, although additional control signals would be required in this instance.

The respective delays of the delay stages 302 are preferably controlled by changing a capacitive loading at the input of each stage. Since the select delay signals SD0 through SD5 preferably employ binary logic levels, each of the delay stages is preferably configured to operate having one of two delays depending on the state of the select delay signal presented thereto. It is to be appreciated that various alternative methodologies are contemplated for selectively controlling the delay of a given delay stage, such as, for example, by controlling a drive strength of the delay stage based at least in part on a control signal presented thereto, as will be understood by those skilled in the art. Moreover, since the select delay signals are not limited to binary signals, a given delay stage may be configured to have more than two possible delay values. It is to be appreciated that, in accordance with another embodiment (not shown), the VRO may employ delay stages having a fixed delay associated therewith, and the number of delay stages in the ring may be selectively varied as a means of controlling the frequency of the VRO output signal.

Figure 4:
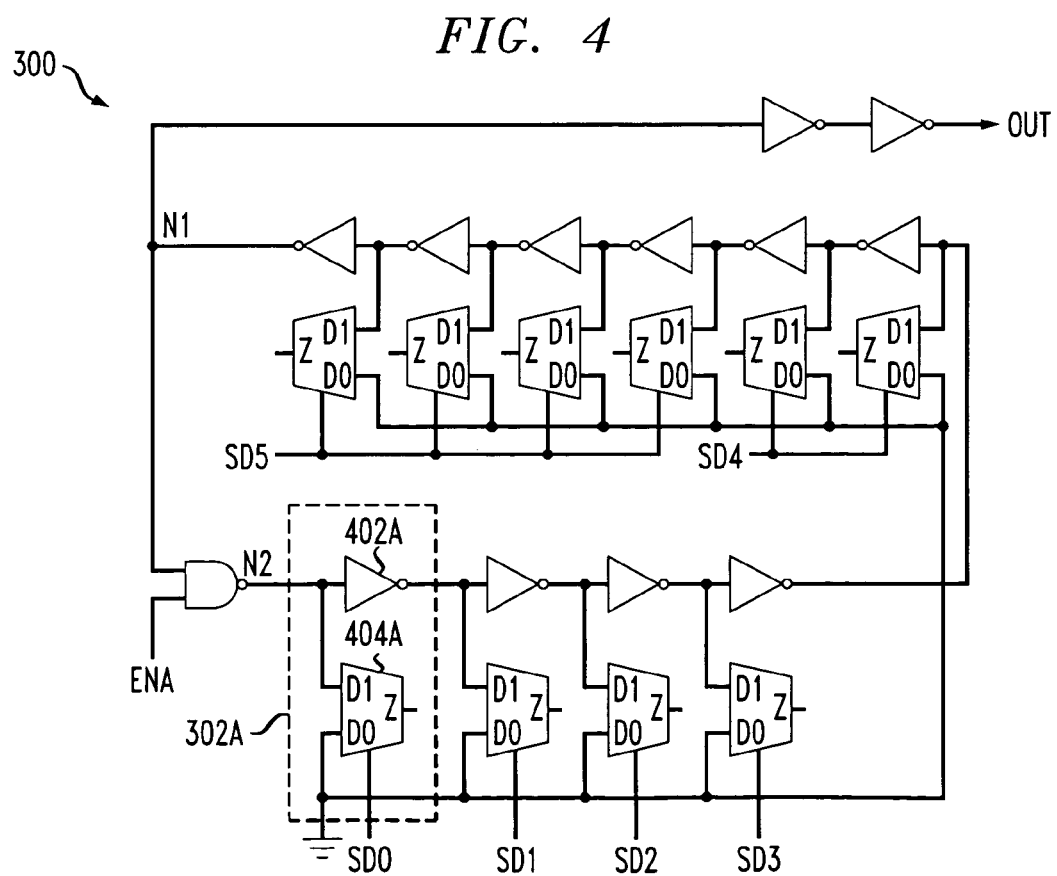
FIG. 4 is a lower-level schematic diagram depicting the ring oscillator shown in FIG. 3.

By way of example only, FIG. 4 depicts a lower-level schematic diagram of the VRO 300 shown in FIG. 3, in accordance with an illustrative embodiment of the invention. As apparent from the figure, each of the delay stages, of which delay stage 302A is representative, preferably comprises an inverter 402A and a multiplexer 404A. The multiplexer 404A includes a first input D1 connected to an input of the inverter 402A and a second input D0 connected to a voltage source, which may be ground. Since the multiplexer is essentially only used to provide capacitive loading at the input of the inverter 402A, an output Z of the multiplexer 404A may be left unconnected. The multiplexer 404A changes the capacitive loading of the inverter 402A in response to the logical state of the select delay input SD0. For instance, when SD0 is a logic low level, input D0 of the multiplexer 404A is selected and input D1 is floating (e.g., tri-stated), thereby providing no significant capacitive loading to inverter 402A. When SD0 is a logic high level, input D1 of the multiplexer 404A is selected, thereby increasing the capacitive loading on inverter 402A and increasing the delay associated with delay stage 302A.

Figure 5:
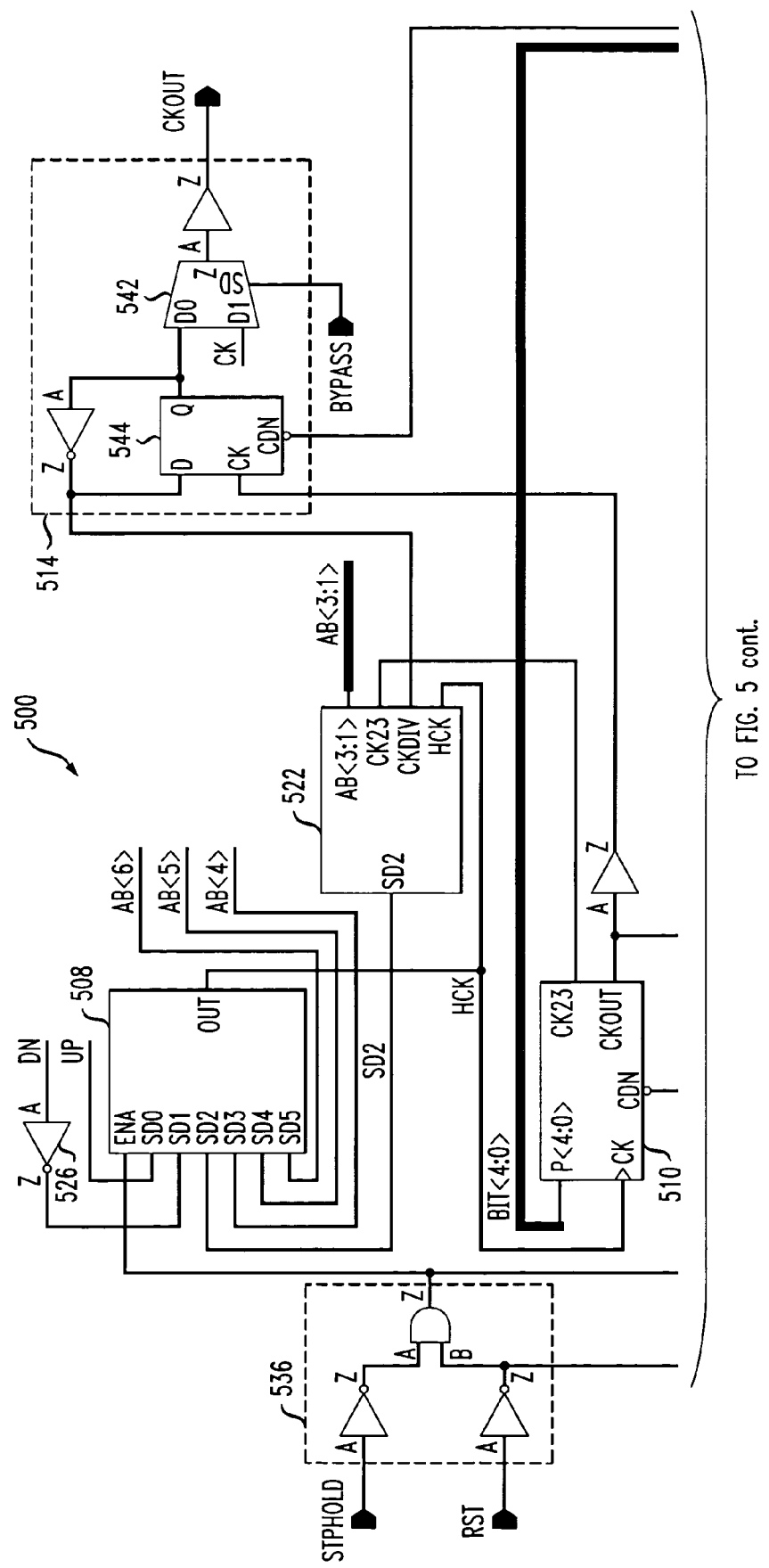
FIG. 5 is a schematic diagram depicting an exemplary implementation of the DPLL circuit shown in FIG. 2, in accordance with the present invention.
Figure 5:
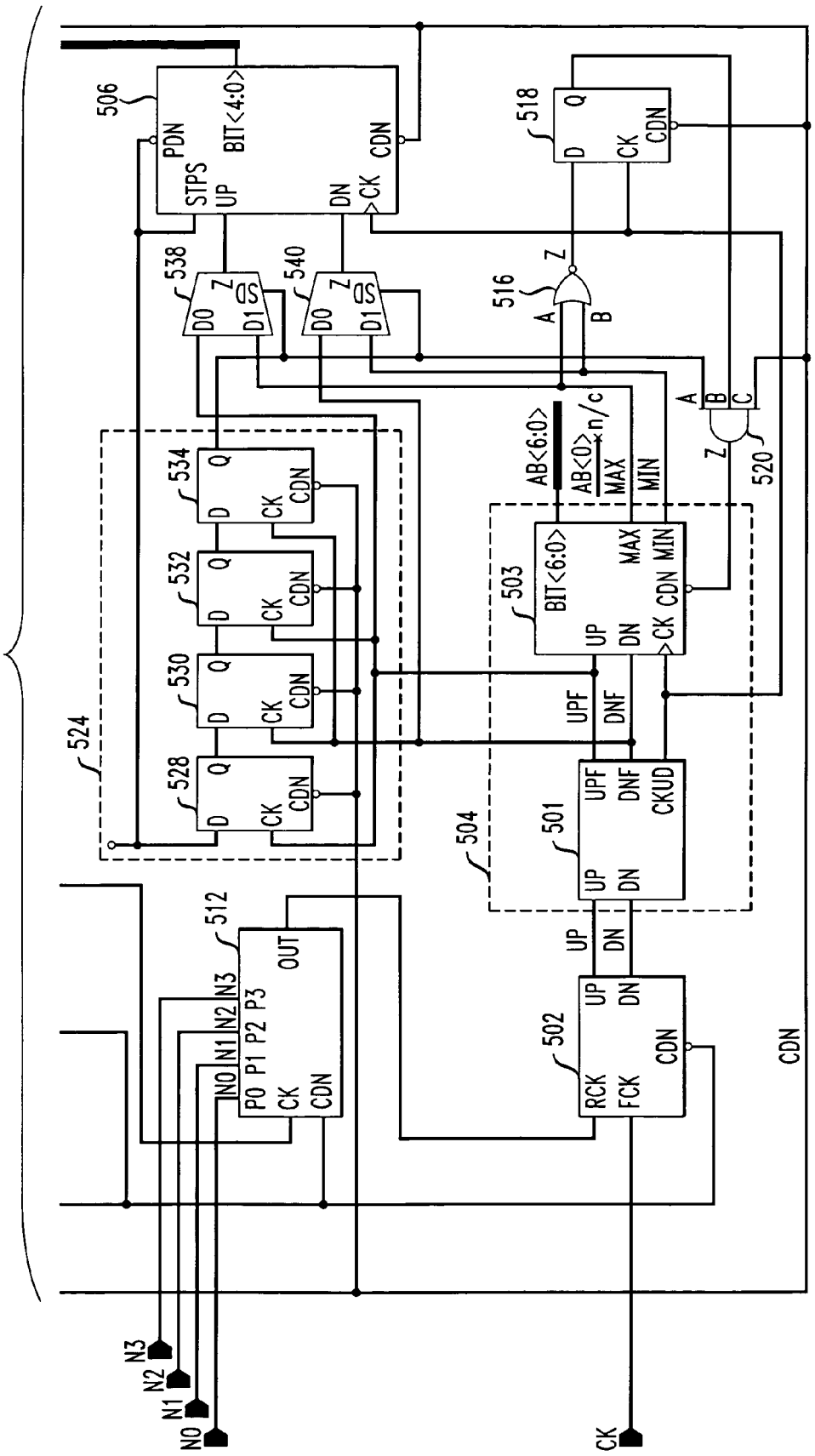

Without loss of generality, FIG. 5 is a schematic diagram depicting an exemplary DPLL 500, formed in accordance with an illustrative embodiment of the invention. The exemplary DPLL 500 comprises a phase detector 502, an averaging UDC 504, a second UDC 506, a VRO 508, a coarse divider 510, a feedback divider 512 and a post divider 514. Each of these functional blocks may be connected together and implemented as previously described in connection with FIGS. 2-4. The DPLL 500 may comprise additional control circuitry, such as, for example, a reset circuit including NOR gate 516, D flip-flop (DFF) 518, and AND gate 520, configured to set the output AB<6:0> of the averaging UDC 504 to a predetermined value (e.g., mid-value) in response to an overflow or an underflow condition generated by the averaging UDC.

The PFD 502 may generate both UP and DN pulses, one pulse being a minimum pulse width and the other pulse indicating a correction value. In some instances it may be desirable to eliminate the pulse having the minimum pulse width. Therefore, the averaging UDC 504 may comprise a UDC 503, which may be implemented in a conventional fashion, and a filter 501. Filter 501 is preferably configured for substantially eliminating UP and DN pulses received from the PFD 502 having a pulse width associated therewith that is less than a designated minimum width. The filtered UP and DN signals are represented by the signals UPF and DNF, respectively. Filter 501 may also generate a clock signal CKUD, based at least in part on the UP and DN signals from the PFD 502, for controlling UDC 503, second UDC 506 and DFF 518.

In the exemplary DPLL 500, the VRO 508 is preferably a 6-bit digitally programmable oscillator having control inputs SD0, SD1, SD2, SD3, SD4 and SD5 for selecting the delay of one or more delay stages therein. A suitable VRO for use with the DPLL 500 is shown in FIGS. 3 and 4, although it is contemplated that alternative variable frequency generator circuit arrangements may also be employed. The three most significant bits (e.g., AB6, AB5, AB4) of the output count generated by the averaging UDC 504 are preferably supplied to corresponding most significant control inputs (e.g., SD5, SD4, SD3, respectively) of the VRO 508. Least significant control inputs SD0 and SD1 of the VRO 508 preferably receive the UP and DN signals generated by the PFD 502. One or more invertors 526 may be used to modify the corresponding signal levels of the UP and/or DN signals so as to provide a desired logic level to the VRO control inputs.

In order to allow a finer control of the average VRO output frequency, the DPLL 500 preferably includes an additional control block 522 configurable for modulating one or more control signals, such as, for example, signal SD2, with a time weighted signal. The control block 522 preferably generates control signal SD2 based at least in part on bits AB3, AB2 and AB1 of the output count generated by the averaging UDC 504, SD2, VRO output signal HCK, and one or more divided clock signals CK23 and CKDIV generated by coarse divider 510 and post divider 514, respectively. As apparent from the figure, least significant bit AB0 of the output count generated by the averaging UDC 504 is not used in the illustrative embodiment, and therefore becomes part of the averaging. Bit AB0 can also be used for expanding the VRO 508 to a seven-bit programmable oscillator (not shown), if desired.

The DPLL 500 may include a control circuit 524 that is configurable for bypassing the averaging UDC 204, at least initially (e.g., prior to locking), as previously described. During start-up, for example, control circuit 524 is preferably operational in a bypass mode wherein the averaging UDC 504 is bypassed to allow the DPLL to more quickly determine an approximate divide value for the coarse divider 510, thereby speeding the locking process. While in the bypass mode, the averaging UDC may be held to a predetermined count value, such as a mid-scale value. Additionally, the second UDC 506 is preferably configured to receive the filtered UP and DN signals UPF, DNF via multiplexers 538 and 540, respectively. After a designated number of clock cycles (e.g., eight), the control circuit 524 preferably switches to a normal mode of operation in which the averaging UDC 504 is able to control the VRO 508. During the normal mode, the second UDC 506 is preferably configured to receive overflow and underflow signals MAX and MIN from the averaging UDC 504 via multiplexers 538 and 540, respectively.

The control circuit 524 in the exemplary DPLL 500 comprises four DFFs 528, 530, 532 and 534 configured as a divide-by-eight counter. It is to be appreciated that the invention is not limited to the precise circuit arrangement shown in the figure. One or more of the DFFs may be clocked by the filtered UP and DN signals UPF and DNF, respectively. For example, DFFs 528 and 532 are clocked by signal UPF, and DFFs 530 and 534 are clocked by signal DNF. The control circuit 524 preferably generates an output 536 that is supplied to an input (A) of AND gate 520 in the averaging UDC 504 reset circuit.

The DPLL 500 preferably includes a main reset circuit 536 configured to reset the DPLL in response to a reset control signal RST presented thereto. While reset control signal RST is asserted (e.g., logic "1"), reset circuit 536 is preferably c operable to disable VRO 508 and reset one or more of PFD 502, averaging UDC 504 (via AND gate 520), second UDC 506, coarse divider 510, feedback divider 512, post divider 514 and DFF 518. Reset circuit 536 may further be configured to stop the DPLL without resetting the averaging UDC 504 or the second UDC 506. This permits the DPLL 500 to be selectively stopped in response to assertion of a stop control signal STPHOLD presented thereto, and to subsequently resume operation at the same frequency as before the stop control signal was asserted. This may be useful, for example, as part of a power saving mode of operation. The reset circuit 536 may include additional circuitry (not shown) which provides synchronization after the stop control signal STPHOLD is deactivated (e.g., logic "0"). For example, the reset circuit 536 may be configurable to delay the feedback divider 512 slightly in order to align a phase of the VRO output signal HCK with a phase of the incoming reference signal CK, thereby obtaining a substantially zero-phase start.

The post divider 514 in the exemplary DPLL 500 is set to divide by two via a DFF 544, although the post divider 514 is not limited to a particular divide value. Additionally, the post divider 514 may include bypass circuitry, such as, for example, a multiplexer 542, configured to enable either the reference input signal CK or a division of the VRO output signal to be selected as an output CKOUT of the DPLL based on a bypass control signal BYPASS presented to the post divider 514. This may be beneficial, for example, for providing a testing and/or diagnostic mode of operation of the DPLL.

Feedback divider 512, like the post divider 514, may be set to have a fixed divide value. Preferably, feedback divider 512 comprises a programmable divider which is configured for providing a selectable divide value based on one or more divider select signals N0, N1, N2 and N3 presented to the DPLL.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A phase-locked loop, comprising:
a variable frequency generator configurable for generating an output signal having a frequency which varies based at least in part on at least first and second control signals presented thereto;
a comparator configurable for receiving a first signal and a second signal, the first signal being an input signal presented to the phase-locked loop and the second signal being representative of the output signal from the variable frequency generator, the comparator generating a difference signal representative of a difference between at least one of a phase and a frequency of the first and second signals, the difference signal comprising the first control signal; and
a first counter configurable for generating an output count based at least in part on the difference signal from the comparator, the output count being a digital representation of the difference signal, the output count comprising the second control signal;
wherein the frequency of the output signal from the variable frequency generator is determined as a function of the difference signal and the output count.

2. The phase-locked loop as set forth in claim 1, further comprising a first divider connected between the variable frequency generator and the comparator, the first divider having a selectable divide value associated therewith and being configurable for receiving the output signal from the variable frequency generator and for generating the second signal based on the divide value.

3. The phase-locked loop as set forth in claim 2, wherein the first counter is further configurable for generating a third control signal in response to the first counter generating one of an overflow and an underflow, the divide value in the first divider being selected based on the third control signal.

4. The phase-locked loop as set forth in claim 2, further comprising a second counter configurable for generating an output count in response to the first counter generating one of an overflow and an underflow, the output count of the second counter representing a duration of one of the overflow and the underflow of the first counter, the divide value of the first divider being selected based on the output count of the second counter.

5. The phase-locked loop as set forth in claim 1, wherein the difference signal being a first value causes the output count to increase and the frequency of the output signal from the variable frequency generator to decrease, and the difference signal being a second value causes the output count to decrease and the frequency of the output signal from the variable frequency generator to increase.

6. The phase-locked loop as set forth in claim 1, wherein the difference signal being a first value causes the output count to increase and the frequency of the output signal from the variable frequency generator to increase, and the difference signal being a second value causes the output count to decrease and the frequency of the output signal from the variable frequency generator to decrease.

7. The phase-locked loop as set forth in claim 1, wherein the variable frequency generator comprises a plurality of delay stages including first and last stages, the plurality of delay stages being connected in a ring configuration, such that an output of a given delay stage is coupled to an input of a successive delay stage, the output of the last stage being coupled to the input of the first stage.

8. The phase-locked loop as set forth in claim 1, wherein the counter comprises an up/down counter.

9. The phase-locked loop as set forth in claim 1, wherein the first divider comprises a programmable counter.

10. The phase-locked loop as set forth in claim 1, wherein the comparator comprises at least one of a phase detector and a frequency detector.

11. The phase-locked loop as set forth in claim 1, wherein the comparator comprises a type-four phase detector.

12. A phase-locked loop, comprising:
a variable frequency generator configurable for generating an output signal having a frequency which varies based at least in part on a first control signal presented thereto;
a comparator configurable for receiving a first signal and a second signal, the first signal being an input signal presented to the phase-locked loop and the second signal being representative of the output signal from the variable frequency generator, the comparator generating a difference signal representative of a difference between at least one of a phase and a frequency of the first and second signals;
a first counter configurable for generating an output count based at least in part on the difference signal from the comparator, the output count being a digital representation of the difference signal, the output count of the first counter comprising the first control signal, the frequency of the output signal from the variable frequency generator being determined as a function of the output count of the first counter;
a first divider connected between the variable frequency generator and the comparator, the first divider having a selectable divide value associated therewith and being configurable for receiving the output signal from the variable frequency generator and for generating the second signal based on the divide value; and
a second counter configurable for generating an output count in response to the first counter generating one of an overflow and an underflow, the output count of the second counter representing a duration of one of the overflow and the underflow of the first counter, the divide value of the first divider being selected based on the output count of the second counter.

13. The phase-locked loop as set forth in claim 12, wherein the difference signal being a first value causes the output count to increase and the frequency of the output signal from the variable frequency generator to decrease, and the difference signal being a second value causes the output count to decrease and the frequency of the output signal from the variable frequency generator to increase.

14. The phase-locked loop as set forth in claim 12, wherein the difference signal being a first value causes the output count to increase and the frequency of the output signal from the variable frequency generator to increase, and the difference signal being a second value causes the output count to decrease and the frequency of the output signal from the variable frequency generator to decrease.

15. The phase-locked loop as set forth in claim 12, wherein the variable frequency generator comprises a plurality of delay stages including first and last stages, the plurality of delay stages being connected in a ring configuration, such that an output of a given delay stage is coupled to an input of a successive delay stage, the output of the last stage being coupled to the input of the first stage.

16. The phase-locked loop as set forth in claim 12, wherein the first counter comprises an up/down counter.

17. The phase-locked loop as set forth in claim 12, wherein the second counter comprises an up/down counter.

18. The phase-locked loop as set forth in claim 12, wherein the first divider comprises a programmable counter.

19. The phase-locked loop as set forth in claim 12, wherein the comparator comprises at least one of a phase detector and a frequency detector.

20. An integrated circuit including at least one phase-locked loop, the at least one phase-locked loop comprising:
- a variable frequency generator configurable for generating an output signal having a frequency which varies based at least in part on at least first and second control signals presented thereto;
- a comparator configurable for receiving a first signal and a second signal, the first signal being an input signal presented to the phase-locked loop and the second signal being representative of the output signal from the variable frequency generator, the comparator generating a difference signal representative of a difference between at least one of a phase and a frequency of the first and second signals, the difference signal comprising the first control signal; and
- a first counter configurable for generating an output count based at least in part on the difference signal from the comparator, the output count being a digital representation of the difference signal, the output count comprising the second control signal;
- wherein the frequency of the output signal from the variable frequency generator is determined as a function of the difference signal and the output count.

21. An integrated circuit including at least one phase-locked loop, the at least one phase-locked loop comprising:
- a variable frequency generator configurable for generating an output signal having a frequency which varies based at least in part on a first control signal presented thereto;
- a comparator configurable for receiving a first signal and a second signal, the first signal being an input signal presented to the phase-locked loop and the second signal being representative of the output signal from the variable frequency generator, the comparator generating a difference signal representative of a difference between at least one of a phase and a frequency of the first and second signals;
- a first counter configurable for generating an output count based at least in part on the difference signal from the comparator, the output count being a digital representation of the difference signal, the output count of the first counter comprising the first control signal, the frequency of the output signal from the variable frequency generator being determined as a function of the output count of the first counter;
- a first divider connected between the variable frequency generator and the comparator, the first divider having a selectable divide value associated therewith and being configurable for receiving the output signal from the variable frequency generator and for generating the second signal based on the divide value; and
- a second counter configurable for generating an output count in response to the first counter generating one of an overflow and an underflow, the output count of the second counter representing a duration of one of the overflow and the underflow of the first counter, the divide value of the first divider being selected based on the output count of the second counter.

* * * * *